United States Patent
Chen

(10) Patent No.: US 7,767,321 B2
(45) Date of Patent: Aug. 3, 2010

(54) MAGNETIC RECORDING MEDIUM

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 888 days.

(21) Appl. No.: 11/309,660

(22) Filed: Sep. 7, 2006

(65) Prior Publication Data
US 2007/0172706 A1 Jul. 26, 2007

(30) Foreign Application Priority Data
Jan. 24, 2006 (CN) .................... 2006 1 0033474

(51) Int. Cl.
*G11B 5/66* (2006.01)
(52) U.S. Cl. .................................................... 428/831
(58) Field of Classification Search ................ None
See application file for complete search history.

(56) References Cited

U.S. PATENT DOCUMENTS

| 6,183,606 B1 | 2/2001 | Kuo et al. | |
| 2005/0202287 A1* | 9/2005 | Lu et al. | 428/831.2 |
| 2005/0249981 A1 | 11/2005 | Cheng et al. | |
| 2006/0154110 A1* | 7/2006 | Hohlfeld et al. | 428/823 |
| 2007/0065955 A1* | 3/2007 | Maeda et al. | 438/3 |

OTHER PUBLICATIONS

Wang et al.. "Sefl-assembled Co nanorods in diamond-like carbon thin films synthesized by plasma-assisted magnetron sputtering", Appl, Phys Lett, vol. 83, No. 12, Sep. 2003, pp. 2423-2425.*
Kolobov et al.. "Local structure of Co nanocrystals embedded in hydrogenated amorphous carbon: An x-ray absorption study", J Appl Phys, vol. 92, No. 10, Nov. 2002, pp. 6195-6199.*

* cited by examiner

*Primary Examiner*—Holly Rickman
(74) *Attorney, Agent, or Firm*—Jeffrey T. Knapp

(57) ABSTRACT

An exemplary magnetic recording medium with a high recording density and a low medium noise is provided. The magnetic recording medium includes a non-magnetic substrate, a soft magnetic layer, an oxygen-containing intermediate layer, and a perpendicular magnetic recording layer, arranged in contact with one another, in that particular order. The perpendicular magnetic recording layer has a composite layer structure with ferromagnetic grains and a matrix of an amorphous carbon-containing structure. The amorphous carbon-containing structure is dispersed so as to essentially surround the individual ferromagnetic grains, within the perpendicular magnetic recording layer. Methods for making such magnetic recording media also are provided.

8 Claims, 5 Drawing Sheets

MAGNETIC RECORDING MEDIUM

FIELD OF THE INVENTION

This invention relates generally to magnetic recording media and, more particularly, to perpendicular magnetic recording media and method for making the same.

DESCRIPTION OF RELATED ART

Nowadays, magnetic recording media are extensively used in the computer industry. Magnetic recording media are generally classified into longitudinal magnetic recording media and perpendicular magnetic recording media. A magnetic recording medium can be locally magnetized by a write transducer so as to record and store information. The write transducer can create a highly concentrated magnetic field, which alternates direction based upon bits of the information being stored. When the local magnetic field produced by the write transducer is greater than the coercivity (Hc) of the magnetic recording medium, grains (i.e., individual crystals in a polycrystalline formation) of the recording medium at that location are magnetized. The grains retain their magnetization after the magnetic field produced by the write transducer is removed. The magnetization of the recording medium can subsequently produce an electrical response to a read sensor so as to allow the information to be read.

Until recently, perpendicular magnetic recording media have been considered powerful and competitive recording devices due to their relatively high recording densities. However, the most important problem regarding perpendicular magnetic recording media is how to further increase their recording density to meet future storage demands. A high recording density medium needs high coercivity (Hc). At present, CoCrPtM (M=B, Ni, Ta, W, Nb) alloy thin films are the most widely used magnetic recording materials for hard disk drives, due to their relatively high coercivity (Hc>2800 oersted (Oe)). However, these alloy thin films have two disadvantages for high recording density applications: (1) medium noise (or media noise) is too high; and (2) the coercivity is still not as high as desired. Therefore, it is difficult to further increase the recording density to meet future storage demands via the use of such alloy thin films. For these metallic films, the most significant problem is the medium noise that results from magnetic exchange coupling between the grains located at the domain transition region. If the recording density of the metallic film is to be increased, the grain size of the metallic film must be reduced. However, when the grain size of the metallic film is decreased to a single-domain size, the resulting high medium noise leads to read-write error and system instability, due to the lack of sufficient space between grains to reduce/minimize the magnetic exchange coupling therebetween.

What is needed, therefore, is a perpendicular magnetic recording medium that can attain a high recording density and low medium noise and a method for making such a perpendicular magnetic recording medium.

SUMMARY OF THE INVENTION

A magnetic recording medium, in accordance with a preferred embodiment, is provided. The magnetic recording medium includes a non-magnetic substrate, a soft magnetic layer, an oxygen-containing intermediate layer, and a perpendicular magnetic recording layer, arranged in that order. The perpendicular magnetic recording layer has a composite layer structure with ferromagnetic grains and an amorphous carbon-containing structure. The amorphous carbon-containing structure is dispersed so as to essentially surround the individual ferromagnetic grains within the perpendicular magnetic recording layer. Accordingly, each ferromagnetic grain is bounded only by the amorphous carbon-containing structure within the perpendicular magnetic recording layer.

A method for making a magnetic recording medium, in accordance with another preferred embodiment, is provided. The method includes the following steps: preparing a non-magnetic substrate; forming a soft magnetic layer on the non-magnetic substrate; then depositing an oxygen-containing intermediate layer on the soft magnetic layer; and co-sputtering a ferromagnetic material target and a carbon target on the oxygen-containing intermediate layer. Through this method a magnetic recording medium, which has a perpendicular magnetic recording layer having a composite layer structure with ferromagnetic grains and an amorphous carbon-containing structure dispersed around the ferromagnetic grains, may be formed.

The magnetic recording medium and method for making the same, in accordance with the preferred embodiments, can achieve a high recording density and low medium noise. This combination of traits is possible because the ferromagnetic grains of the perpendicular magnetic recording layer are isolated by the surrounding amorphous carbon-containing structure. Accordingly, magnetic exchange coupling between the ferromagnetic grains is reduced, and a high signal-noise ratio (SNR) is achieved. Furthermore, because the amorphous carbon-containing structure is usually hard and wear-resistant, a flying height (i.e., working clearance) of a recording head can be effectively minimized when the perpendicular magnetic recording medium is employed into magnetic recording devices, such as hard disk drives.

Other advantages and novel features will become more apparent from the following detailed description of embodiments when taken in conjunction with the accompanying drawings.

BRIEF DESCRIPTION OF THE DRAWINGS

Many aspects of the present magnetic recording medium and the related method for making the same can be better understood with reference to the following drawings. The components in the drawings are not necessarily drawn to scale, the emphasis instead being placed upon clearly illustrating the principles of the present magnetic recording medium and the method of making such. Moreover, in the drawings, like reference numerals designate corresponding parts throughout the several views.

The exemplifications set out herein illustrate several preferred embodiments, in various forms, and such exemplifications are not to be construed as limiting the scope of the present magnetic recording medium and method in any manner.

DETAILED DESCRIPTION OF THE INVENTION

Figure 1:
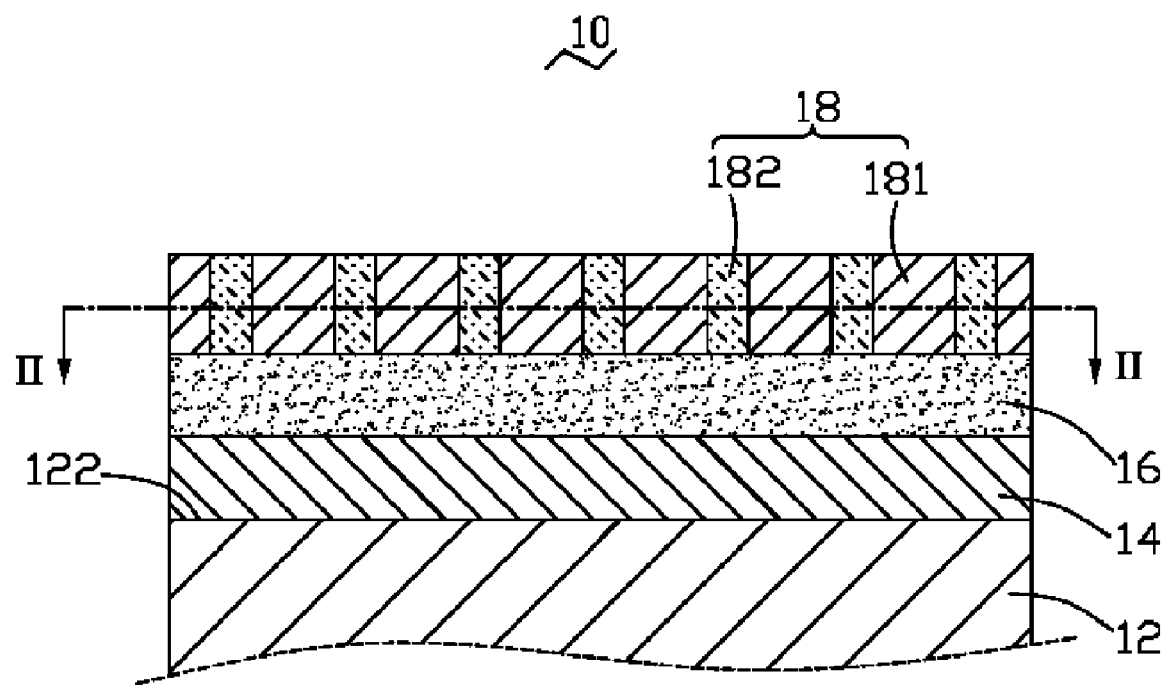
FIG. 1 is a schematic, partial cross-sectional view of a magnetic recording medium, in accordance with a preferred embodiment.

FIG. 1 shows a magnetic recording medium 10 in accordance with the present invention. The recording medium 10 includes a non-magnetic substrate 12, a soft magnetic layer 14, an oxygen-containing intermediate layer 16, and a magnetic recording layer 18, arranged in that order.

The non-magnetic substrate 12 has an upper surface 122. The soft magnetic layer 14, the oxygen-containing intermediate layer 16 and the magnetic recording layer 18 are formed on the upper surface 122, in sequence. Usually, the non-magnetic substrate 12 can be a nickel-phosphorus coated aluminum (Ni—P/Al) substrate, a glass substrate, a glass-ceramic substrate, or other suitable non-magnetic substrate material.

The soft magnetic layer 14, located adjacent to each of the non-magnetic substrate 12 and the oxygen-containing intermediate layer 16, is beneficially made of a soft magnetic material, such as an iron-nickel (Fe—Ni) alloy, an iron carbide (FeCx), an iron-silicon-aluminum (Fe—Si—Al) alloy, an iron-cobalt-boron (Fe—Co—B) alloy, a nickel-iron-copper-molybdenum (Ni—Fe—Cu—Mo) alloy, a cobalt-zirconium-niobium (Co—Zr—Nb) alloy, a nickel-iron-niobium (Co—Fe—Nb) alloy, or a mixture thereof. The soft magnetic layer 14 has a magnetic orientation substantially parallel to the upper surface 122 of the non-magnetic substrate 12, which gives the magnetic recording medium 10 a high writing efficiency. A thickness of the soft magnetic layer 14 is usually about in the range from 2 to 200 nanometers and, preferably, should be in the approximate range from 5 to 100 nanometers.

The oxygen-containing intermediate layer 16 is usefully made of a metal oxide, such as a chromium oxide (CrOx), a cobalt oxide (CoOx), a ruthenium oxide (RuOx), a tantalum oxide (TaOx), another suitable transition metal oxide, or a combination thereof. The oxygen-containing intermediate layer 16 is beneficially in the form of a granular film (i.e., comprised of oxide particles). The oxygen-containing intermediate layer 16 is configured (i.e., structured and arranged) for facilitating the formation of the magnetic recording layer 18 thereon. Particularly, the magnetic recording layer 18 will advantageously have a high perpendicular magnetic anisotropy (i.e., a high magnetic anisotropy energy at a direction substantially perpendicular to the upper surface 122). A thickness of the oxygen-containing intermediate layer 16 is usually in the approximate range from 1 to 10 nanometers and should, preferably, be about in the range from 1 to 5 nanometers.

Figure 2:
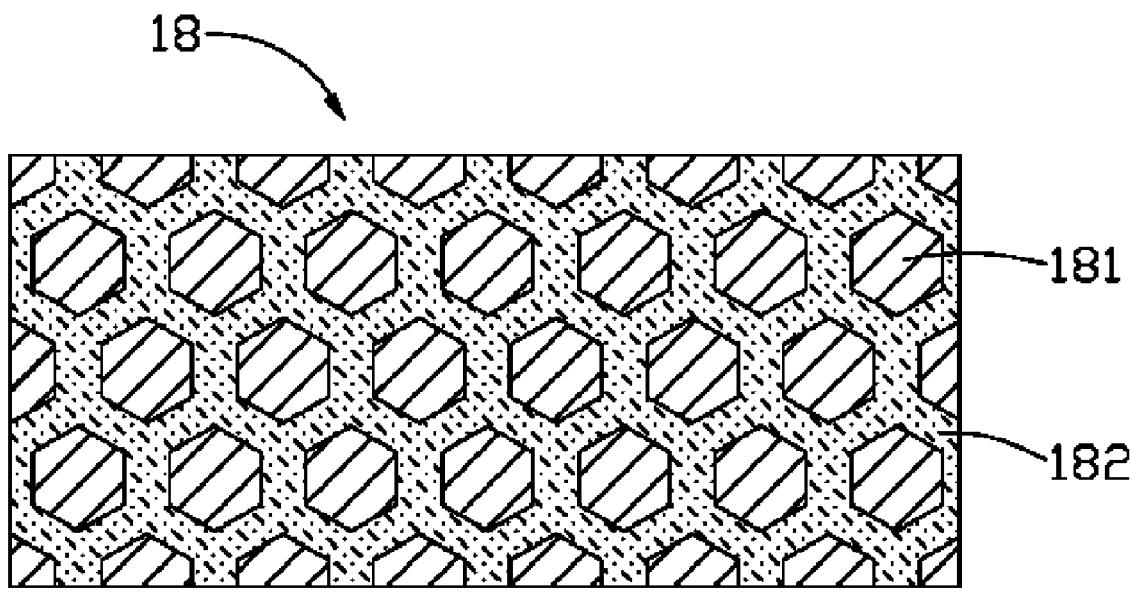
FIG. 2 is a schematic, cross-sectional view of the magnetic recording medium taken along the line II-II of FIG. 1.

Referring to both FIGS. 1 and 2 together, the magnetic recording layer 18 is a composite layer structure with both ferromagnetic grains 181 and an amorphous carbon-containing structure 182. The amorphous carbon-containing structure 182 is dispersed so as to effectively surround the ferromagnetic grains 181. In this manner, each ferromagnetic grain 181 has a grain boundary only with the amorphous carbon-containing structure 182 within the magnetic recording layer 18. However, the top and bottom of each ferromagnetic grain 181 are, beneficially, not in contact with the amorphous carbon-containing structure 182. The top thereof is exposed to potential magnetic treatment, while the bottom is affixed to the oxygen-containing intermediate layer 16. As such, the ferromagnetic grains 181 are essentially magnetically isolated from one another, due to the amorphous carbon-containing structure 182. A thickness of the magnetic recording layer 18 is usually in the range from about 8 to about 25 nanometers and should preferably be in the approximate range from 10 to 15 nanometers.

The ferromagnetic grains 181 each have a magnetic orientation substantially perpendicular to the upper surface 122 of the non-magnetic substrate 12. The ferromagnetic grains 181 are suitably made of metal alloy particles that have a hexagonal close-packed crystal structure, such as cobalt-chromium-based alloy particles. A coercivity (Hc) of the ferromagnetic grains 181 is usually about in the range from 3500 to 6000 oersted (Oe) and should preferably be in the range of about from 3500 to 4500 Oe.

The amorphous carbon-containing structure 182 is advantageously made of a carbon-based non-magnetic material, such as an amorphous diamond-like carbon structure, e.g., an amorphous hydrogenated carbon (a-C:H) structure, an amorphous hydrogen-nitrogenated carbon (a-C:HN) structure, etc. The amorphous carbon-containing structure 182 is configured for facilitating the isolation (i.e., magnetic isolation) of the ferromagnetic grains 181. Such isolation reduces a magnetic exchange coupling among the ferromagnetic grains 181 (e.g., between adjacent and/or proximate grains 181) and helps to achieve a high signal-noise ratio (SNR). Furthermore, the amorphous carbon-containing structure 182 tends to be extremely hard and wear-resistant. As such, when the magnetic recording medium 10 is used in a magnetic recording device, such as in a micro-disk storage device, an ultra-low flying height of a recording head can be achieved.

In the illustrated embodiment, the ferromagnetic grains 181 are made of cobalt-chromium-platinum alloy particles, which have a hexagonal close-packed crystal structure (as shown in FIG. 2). The amorphous carbon-containing structure 182 is made of an amorphous hydrogenated carbon structure. A mole ratio (i.e., atomic ratio) of the amorphous carbon-containing structure 182 to the ferromagnetic grains 181 in the magnetic recording layer 18 is beneficially in the approximate range from 4% to 8%.

Figure 3:
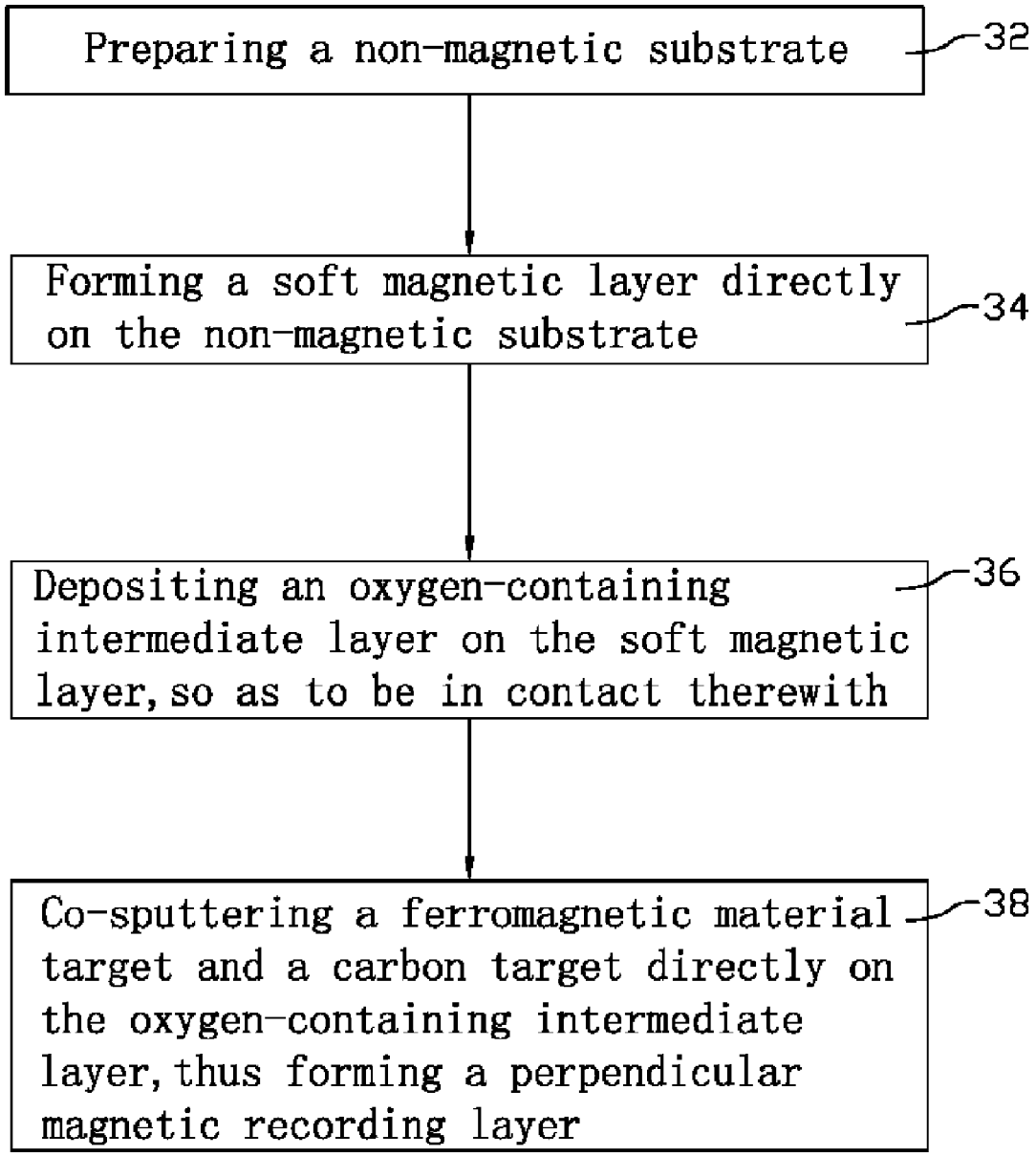
FIG. 3 is a flow chart of a method for making a magnetic recording medium, in accordance with another preferred embodiment.

A method for making the magnetic recording medium 10 having a high perpendicular magnetic anisotropy will be described below in detail with reference to FIGS. 1 and 3. The making method includes the following steps:

step 32: preparing a non-magnetic substrate;

step 34: forming a soft magnetic layer directly on the non-magnetic substrate;

step 36: depositing an oxygen-containing intermediate layer on the soft magnetic layer, so as to be in contact therewith; and step 38: co-sputtering a ferromagnetic material target and a carbon target directly on the oxygen-containing intermediate layer, thus forming a perpendicular magnetic recording layer.

In step 32, the non-magnetic substrate 12, which has an upper surface 122, is prepared. In the illustrated embodiment, the non-magnetic substrate 10 is a nickel-phosphorus coated aluminum substrate used in a hard disk drive. The non-magnetic substrate 10 has a diameter of 65 millimeters and a thickness of 0.635 millimeters.

In step 34, the soft magnetic layer 14 is formed (i.e., coated or otherwise deposited) on the non-magnetic substrate 12, in contact with the upper surface 122 thereof. In the illustrated embodiment, a cobalt-zirconium-niobium alloy target having a diameter of 100 millimeters is provided and a direct current (DC) magnetron sputtering process is carried out in an atmosphere of argon and at an operational pressure of about 0.5 pascals (Pa). The soft magnetic layer 12, composed of a cobalt-zirconium-niobium alloy, can be produced so as to have a predetermined thickness. The thickness of the soft magnetic layer 12 can be controlled by way of adjusting, e.g., a sputtering power and/or a sputtering time of the direct current magnetron sputtering process.

In step 36, the oxygen-containing intermediate layer 16 is formed (i.e., coated or otherwise deposited) directly on the soft magnetic layer 14. In the illustrated embodiment, a cobalt oxide target is prepared, and a direct current magnetron sputtering process is performed in an atmosphere of argon and at an operational pressure of about 0.5 Pa. Therefore, an oxygen-containing intermediate layer 16 having a thickness of about 1 nanometer can be formed.

In step 38, the magnetic recording layer 18, having the composite layer structure of the ferromagnetic grains 181 and the amorphous carbon-containing structure 182, is formed on the oxygen-containing intermediate layer 16, in contact therewith. The amorphous carbon-containing structure 182 acts as the matrix material of the composite structure, surrounding the grain boundaries of the individual ferromagnetic grains 181 within the magnetic recording layer 18 (i.e., grain tops and bottoms not included). In the illustrated embodiment, a carbon target e.g., a graphite block and a cobalt-chromium-platinum alloy target are provided, and a co-sputtering process involving both the carbon target and the cobalt-chromium-platinum alloy target is carried out in an atmosphere of hydrogen-containing gas (e.g., methane, ethane, or hydrogen gas) and at a suitable operational pressure. For example, if the co-sputtering process is a direct current magnetron sputtering process, a suitable operational pressure is about 0.5 pascals; if it is a radio frequency (RF) magnetron sputtering process, a suitable operational pressure is about 2 pascals. Thus, a magnetic recording layer 18 having a composite layer structure with cobalt-chromium-platinum alloy grains dispersed in a matrix of an amorphous hydrogenated carbon structure (i.e., a diamond-like carbon structure) can be obtained. In the co-sputtering process, due to an induction effect of the oxygen-containing intermediate layer 16, the cobalt-chromium-platinum alloy grains selectively grow along a direction substantially perpendicular to the upper surface 122 of the non-magnetic substrate 12. In particular, the oxygen-containing intermediate layer 16 as deposited in which oxide particles act as nucleating sites for the magnetic recording layer 18 and can effectuate a uniform physical segregation of the ferromagnetic grains of the magnetic recording layer 18 by forcing the shape and orientation of the ferromagnetic grains. Accordingly, the magnetic recording medium 10, having a high perpendicular magnetic anisotropy, can be obtained. The growth of ferromagnetic grains from an oxygen-containing intermediate layer is further illustrated in FIGS. 2 and 3 of US 2005/0249981 to Cheng et al., the contents of which are hereby incorporated by reference.

In step 38, it is also should be understood that when the amorphous carbon-containing structure 182 is made of an amorphous hydrogen-nitrogenated carbon structure (i.e., a diamond-like carbon structure), correspondingly, the co-sputtering process should be carried out in an atmosphere including a mixture of nitrogen gas and hydrogen-containing gas.

Figure 4:
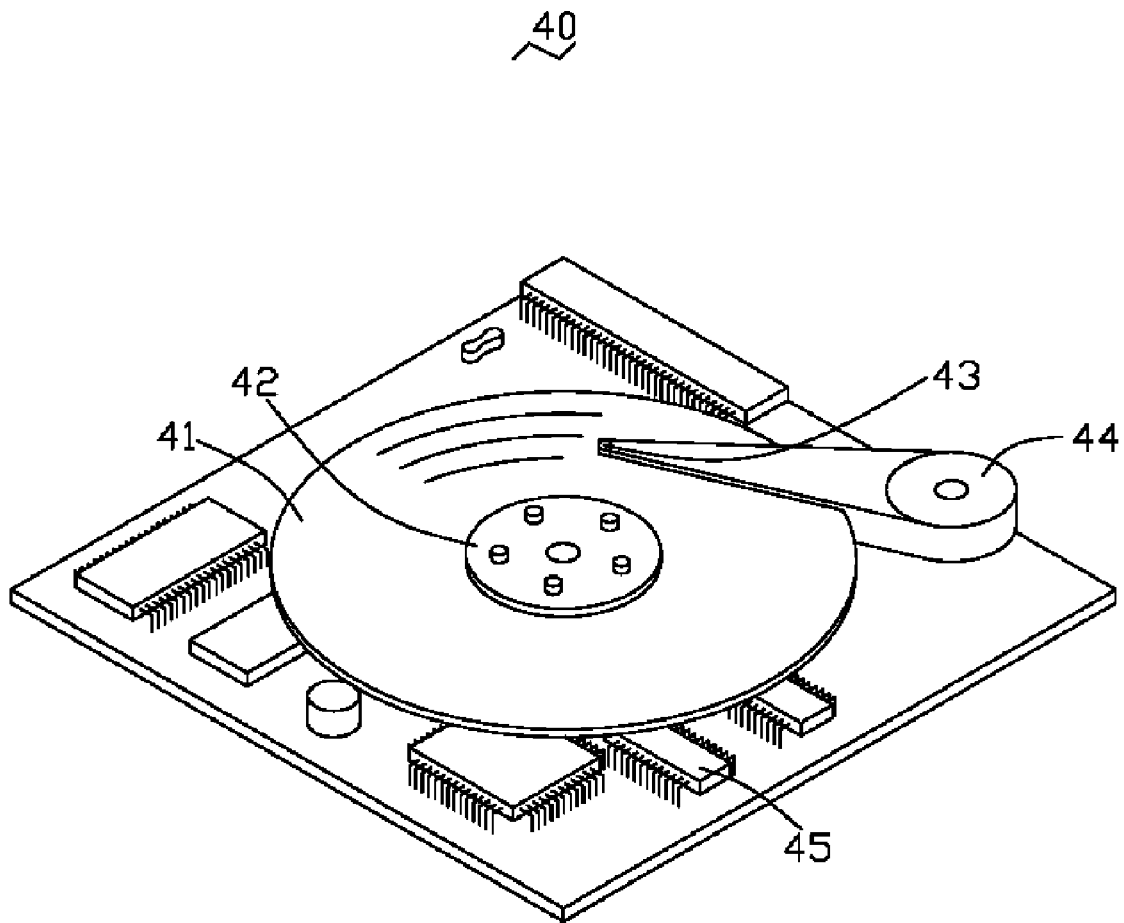
FIG. 4 is a schematic view of a magnetic recording device, in accordance with further another preferred embodiment, the magnetic recording device including a magnetic recording medium and a recording head.

Referring to FIG. 4, a magnetic recording device 40, in accordance with present magnetic recording medium, is provided. The magnetic recording device 40 includes a magnetic recording medium 41, a first actuator 42, a recording head 43, a second actuator 44, and a signal processor unit 45. The magnetic recording medium 41 advantageously is a perpendicular magnetic recording medium 10, as mentioned above. The first actuator 42 is configured for driving the magnetic recording medium 41 to rotate and can be, for example, an axial motor. The second actuator 44 (e.g., a servo-motor) is configured for driving the recording head 43 to read and write information on the magnetic recording medium 41. The signal processor unit 45 is configured for controlling the first actuator 42 and the second actuator 44, as well as the recording head 43.

Figure 5:
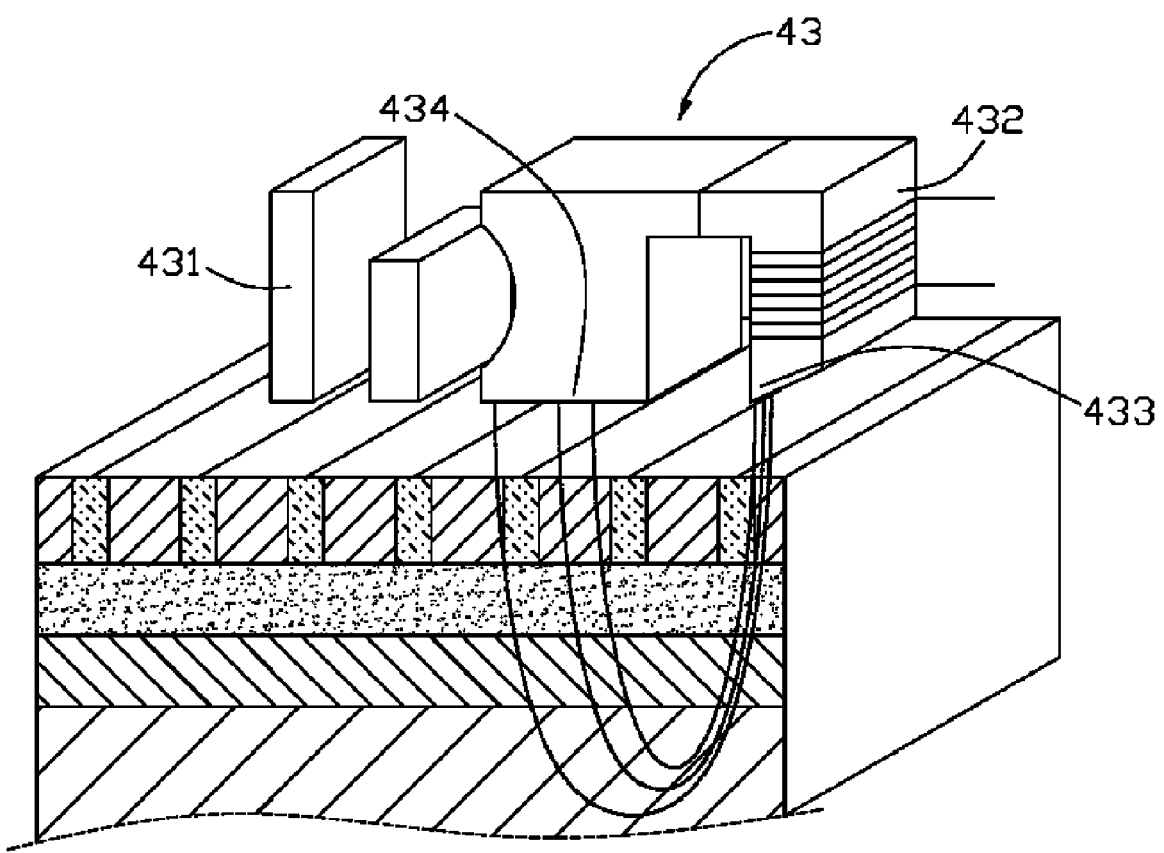
FIG. 5 is an enlarged and partially cut away view of the magnetic recording medium and the recording head of FIG. 4.

Referring to FIG. 5, the recording head 43 includes a read sensor 431 and a write transducer 432. The read sensor 431 is arranged for sensing an electrical response produced by ferromagnetic grains in the perpendicular magnetic recording medium 41. The read sensor 431 can, e.g., be giant magneto-resistance (GMR) sensor. The write transducer 432 is arranged for creating a highly localized concentrated magnetic field, which alternates direction based upon the particular bits of information being stored in the magnetic recording medium 41. The write transducer 432 usually includes a cone-shaped magnetic emitter 433 and a magnetic collector 434, but it is to be understood that any known configuration for a write transducer could be employed.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the present invention.

What is claimed is:

1. A magnetic recording medium, comprising:
   a non-magnetic substrate;
   a soft magnetic layer;
   an oxygen-containing intermediate layer comprised of a material chosen from the group consisting of a chromium oxide, a cobalt oxide, a ruthenium oxide and a tantalum oxide; and
   a perpendicular magnetic recording layer, wherein the perpendicular magnetic recording layer has a composite layer structure including ferromagnetic grains and a matrix of an amorphous carbon-containing structure; the amorphous carbon-containing structure being dispersed so as to essentially surround each individual ferromagnetic grain within the perpendicular magnetic recording layer; the non-magnetic substrate, the soft magnetic layer, the oxygen-containing intermediate layer, and the perpendicular magnetic recording layer being arranged in that order.

2. The magnetic recording medium of claim 1, wherein the oxygen-containing intermediate layer has a thickness in the approximate range from 1 to 10 nanometers.

3. The magnetic recording medium of claim 1, wherein the amorphous carbon-containing structure is made of an amorphous diamond-like carbon structure.

4. The magnetic recording medium of claim 3, wherein the amorphous diamond-like carbon structure is at least one of an amorphous hydrogenated carbon structure and an amorphous hydrogen-nitrogenated carbon structure.

5. The magnetic recording medium of claim 3, wherein a mole ratio of the amorphous diamond-like carbon structure to the ferromagnetic grains in the perpendicular magnetic recording layer is in the approximate range from 4% to 8%.

6. The magnetic recording medium of claim 1, wherein the ferromagnetic grains each have a hexagonal close-packed crystal structure.

7. The magnetic recording medium of claim 6, wherein the ferromagnetic grains are comprised of cobalt-chromium based alloy particles.

8. The magnetic recording medium of claim 1, wherein the soft magnetic layer is comprised of a material selected from the group consisting of an iron-nickel alloy, an iron carbide, an iron-silicon-aluminum alloy, an iron-cobalt-boron alloy, a nickel-iron-copper-molybdenum alloy, a cobalt-zirconium-niobium alloy, a nickel-iron-niobium alloy, and mixtures thereof.

* * * * *